(12) United States Patent
Yamanaka (10) Patent No.: US 7,286,361 B2
(45) Date of Patent: Oct. 23, 2007

(54) HEATSINK

(75) Inventor: Yasuhisa Yamanaka, Daito (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 302 days.

(21) Appl. No.: 11/019,730

(22) Filed: Dec. 21, 2004

(65) Prior Publication Data

US 2005/0180116 A1    Aug. 18, 2005

(30) Foreign Application Priority Data

Jan. 5, 2004    (JP)    ............ 2004-000010 U (51) Int. Cl.
*H05K 7/20* (2006.01)
*F28F 7/00* (2006.01)
*H01L 23/24* (2006.01)

(52) U.S. Cl. ............ 361/704; 165/80.3; 165/185; 257/722; 361/703; 361/719

(58) Field of Classification Search ............ 361/704, 361/719
See application file for complete search history.

(56) References Cited

U.S. PATENT DOCUMENTS 3,670,215 A * 6/1972 Wilkens et al. ............ 257/718
4,605,058 A * 8/1986 Wilens ............ 165/80.2
4,945,401 A * 7/1990 Trunk et al. ............ 257/718
5,311,395 A * 5/1994 McGaha et al. ............ 361/720

FOREIGN PATENT DOCUMENTS

| JP | 50-11458 | 2/1975 |
| JP | 61-72878 | 5/1986 |
| JP | 62-91495 | 6/1987 |
| JP | 02-138761 | 5/1990 |
| JP | 08-088303 | 4/1996 |

* cited by examiner

*Primary Examiner*—Gregory D Thompson
(74) *Attorney, Agent, or Firm*—Peter Ganjian (57) ABSTRACT

Disclosed is a heatsink wherein a first bonding part for mounting the semiconductor component on a substrate and a second bonding part for mounting the heatsink on the substrate are soldered to the substrate by a common solder contact, so that the mounting the semiconductor component on the substrate, the mounting the heatsink on the substrate, and the fixing the heatsink to the semiconductor component can be implemented through a single soldering operation. Thus, the step of attaching the heatsink can be simplified. Since the solder is present in a clearance between the first and second bonding parts, the efficiency of heat dissipation can be enhanced.

10 Claims, 9 Drawing Sheets

HEATSINK

BACKGROUND OF THE INVENTION

1. Field of the Invention

The present invention relates to a heatsink, particularly to a heatsink for a semiconductor component having a radiation fin.

2. Description of Related Art

As a kind of such a heatsink, there is known one attached to a semiconductor component by being soldered to a heat release lead protruding outwardly from a package of the semiconductor component. See claims 10, 13 and 16 in JP-A-2-138761, for instance.

According to this construction, heat guided out of the package by means of the heat release lead is absorbed by the heatsink which then releases the heat at a location further remote from the package. Thus, the efficiency of releasing the heat in the semiconductor component is enhanced.

SUMMARY OF THE INVENTION

However, in the above-described construction, a first bonding site where the semiconductor component is bonded to a substrate and a second bonding site where the heat release lead and the heatsink bonded to each other are different. Hence, a soldering operation is required to be separately performed for each of the bonding sites, deteriorating the operating efficiency.

The above-indicated patent document defines in claim 13 a feature that the heat applied for soldering the semiconductor component to the substrate is utilized for bonding the heat release lead to the heatsink, also. This enables to accomplish bonding at the two sites by a single operation of applying heat. However, even in this method a soldering paste or the like should be applied at both sites beforehand, making the bonding step troublesome.

The present invention has been developed in view of the above-described situations, and an object of the invention is, therefore, to provide a heatsink which can be attached to a semiconductor component by a simple work operation.

To attain the object, a first aspect of the present invention resides in a heatsink formed of a plurality of metallic planar parts, which is connected to an IC package having a radiation fin, the heatsink comprising: a radiation fin connecting portion which is connected to the radiation fin, and formed such that opposite ends of an elongate rectangular part are bent substantially at a right angle in the same direction, so that the radiation fin connecting portion comprises a horizontal part and a pair of vertical parts; and a heat release portion which extends from the radiation fin connecting portion, and which comprises a planar positioning part extending from a side of the horizontal part of the radiation fin connecting portion from which the vertical parts do not extend, in a direction to get away from the vertical parts, and a pair of heat release wings which are formed such that each of lateral end parts of the positioning part with respect to a direction in which the positioning part extends from the horizontal part, is bent in a direction to get away from the positioning part in a crank-like shape, one of the heat release wings being further bent at its end part substantially at a right angle in the same direction as the vertical parts, to provide a supporting part whose end part is corrugated.

By connecting the heatsink formed of the metallic planar parts, to the radiation fin of the IC package, the efficiency of heat dissipation can be enhanced. The heatsink comprises the radiation fin connecting portion which is connected to the radiation fin, and the heat release portion extending from the radiation fin connecting portion. Thus, the heatsink is constructed such that the heat in the radiation fin is absorbed, at the radiation fin connecting portion, and the absorbed heat is released outside at the heat release portion. Comprising the horizontal part and the pair of vertical parts, the radiation fin connecting portion can contact the radiation fin at a relatively wide area. Thus, the radiation fin connecting portion can efficiently absorb the heat in the radiation fin.

By soldering an end of each of the pair of vertical parts to a substrate on which the IC package is to be mounted while orienting the end of each vertical part toward the substrate, the heatsink can be fixed to the substrate. By this arrangement, the heatsink can be mounted on the substrate at the same time when an electronic component is mounted on the substrate. That is, a separate step of attaching the heatsink is not required. Further, end parts of the radiation fin can be bonded to the substrate by same solder contacts together with ends of the vertical parts. Thus, a path of heat transfer is formed between the radiation fin and heatsink by the solder contacts, the heat can be transferred from the radiation fin to the heatsink with reliability.

Since the positioning part is disposed to extend from a side of the horizontal part from which the vertical parts do not extend, in the direction to get away from the vertical parts, the heat in the IC package can be released at the positioning part which is located off the radiation fin connecting portion. The heat can also be released from the heat release wings, enhancing the efficiency of heat dissipation. Further, since each of the heat release wings extends in the crank-like shape in each direction to get away from the positioning part, the heat can be released at a location remote from the positioning part and the radiation fin connecting portion. In addition, by arranging such that each of the heat release wings extends in the crank-like shape in each direction to get away from the positioning part, the heat release wings can be located remote from the substrate, also. Accordingly, interference between a component mounted adjacent to the IC package on the substrate and the heat release wings is prevented.

The provision of the supporting part increases an area of the heat release portion, further enhancing the efficiency of heat dissipation. Further, by soldering an end of the supporting part to the substrate, the heatsink can be firmly fixed to the substrate. For instance, when the end part of the supporting part is inserted through a mounting hole formed in the substrate to be soldered to the substrate, since the end part is caught at and by the mounting hole due to the presence of the corrugation formed in the end part, a displacement of the heatsink on the substrate during the soldering operation can be prevented.

A second aspect of the invention resides in a heatsink formed of a plurality of metallic planar parts, which is connected to an IC package having a radiation fin, the heatsink comprising: a radiation fin connecting portion which is connected to the radiation fin, and formed such that opposite ends of an elongate rectangular part are bent substantially at a right angle in the same direction so that the radiation fin connecting portion comprises a horizontal part and a pair of vertical parts; and a heat release portion which extends from the radiation fin connecting portion.

By connecting the heatsink formed of the metallic planar parts, to the radiation fin of the IC package, the efficiency of heat dissipation can be enhanced. The heatsink comprises the radiation fin connecting portion which is connected to the radiation fin, and the heat release portion extending from the radiation fin connecting portion. Thus, the heatsink is constructed such that the heat in the radiation fin is absorbed at the radiation fin connecting portion, and the absorbed heat is released outside at the heat release portion. Comprising the horizontal part and the pair of vertical parts, the radiation fin connecting portion can contact the radiation fin at a relatively wide area. Thus, the radiation fin connecting portion can efficiently absorb the heat in the radiation fin.

By soldering an end of each of the pair of vertical parts to a substrate on which the IC package is to be mounted while orienting the end of each vertical part toward the substrate, the heatsink can be fixed to the substrate. By this arrangement, the heatsink can be mounted on the substrate at the same time when an electronic component is mounted on the substrate. That is, a separate step of attaching the heatsink is not required. Further, end parts of the radiation fin can be bonded to the substrate by same solder contacts together with ends of the vertical parts. Thus, a path of heat transfer is formed between the radiation fin and heatsink by the solder contacts, the heat can be transferred from the radiation fin to the heatsink with reliability.

In the second aspect, according to a third aspect of the invention, the heatsink is such that a positioning part extends from a side of the horizontal part of the radiation fin connecting portion from which the vertical parts do not extend, in a direction to get away from the vertical parts.

Since the positioning part is provided to extend from a side of the horizontal part from which the vertical parts do not extend, in the direction to get away from the vertical parts, the heat can be released from the positioning part which is located off the radiation fin connecting portion. Further, by having the positioning part contact the IC package, the heatsink can be positioned relative to the IC package.

In the third aspect, according to a fourth aspect of the invention, the heatsink is such that the heat release portion comprises a pair of heat release wings which are formed such that each of lateral end parts of the positioning part with respect to a direction in which the positioning part extends from the horizontal part, is bent in a direction to get away from the positioning part in a crank-like shape.

Since the heat can be released from the heat release wings also, the efficiency of heat dissipation is further enhanced. Further, since each of the heat release wings extends in the crank-like shape in each direction to get away from the positioning part, the heat can be released at a location remote from the positioning part and the radiation fin connecting portion. In addition, by arranging such that each of the heat release wings extends in the crank-like shape in each direction to get away from the positioning part, the heat release wings can be located remote from the substrate, also. Accordingly, interference between a component mounted adjacent to the IC package on the substrate and the heat release wings is prevented.

In the fourth aspect, according to a fifth aspect of the invention, one of the heat release wings is further bent at its end part substantially at a right angle in the same direction as the vertical parts, to provide a supporting part.

The provision of the supporting part increases an area of the heat release portion, further enhancing the efficiency of heat dissipation. Further, by soldering an end of the supporting part to the substrate, the heatsink can be firmly fixed to the substrate.

In the fifth aspect, according to a sixth aspect of the invention, an end part of the supporting part is corrugated.

When the end part of the supporting part is inserted through a mounting hole formed in the substrate to be soldered to the substrate, since the end part is caught at and by the mounting hole due to the presence of the corrugation formed in the end part, a displacement of the heatsink on the substrate during the soldering operation can be prevented.

EFFECTS OF THE INVENTION

According to the first aspect and second aspect, a heatsink easily attachable to an IC package can be provided.

According to the third aspect, the efficiency of heat dissipation can be further enhanced.

According to the fourth aspect, the efficiency of heat dissipation can be further enhanced.

According to the fifth aspect, the heatsink can be stably fixed to the substrate.

According to the sixth aspect, a displacement of the heatsink can be prevented.

Other and further objects, features and advantages of the invention will appear more fully from the following description.

DETAILED DESCRIPTION OF THE PREFERRED EMBODIMENTS

Figure 1:
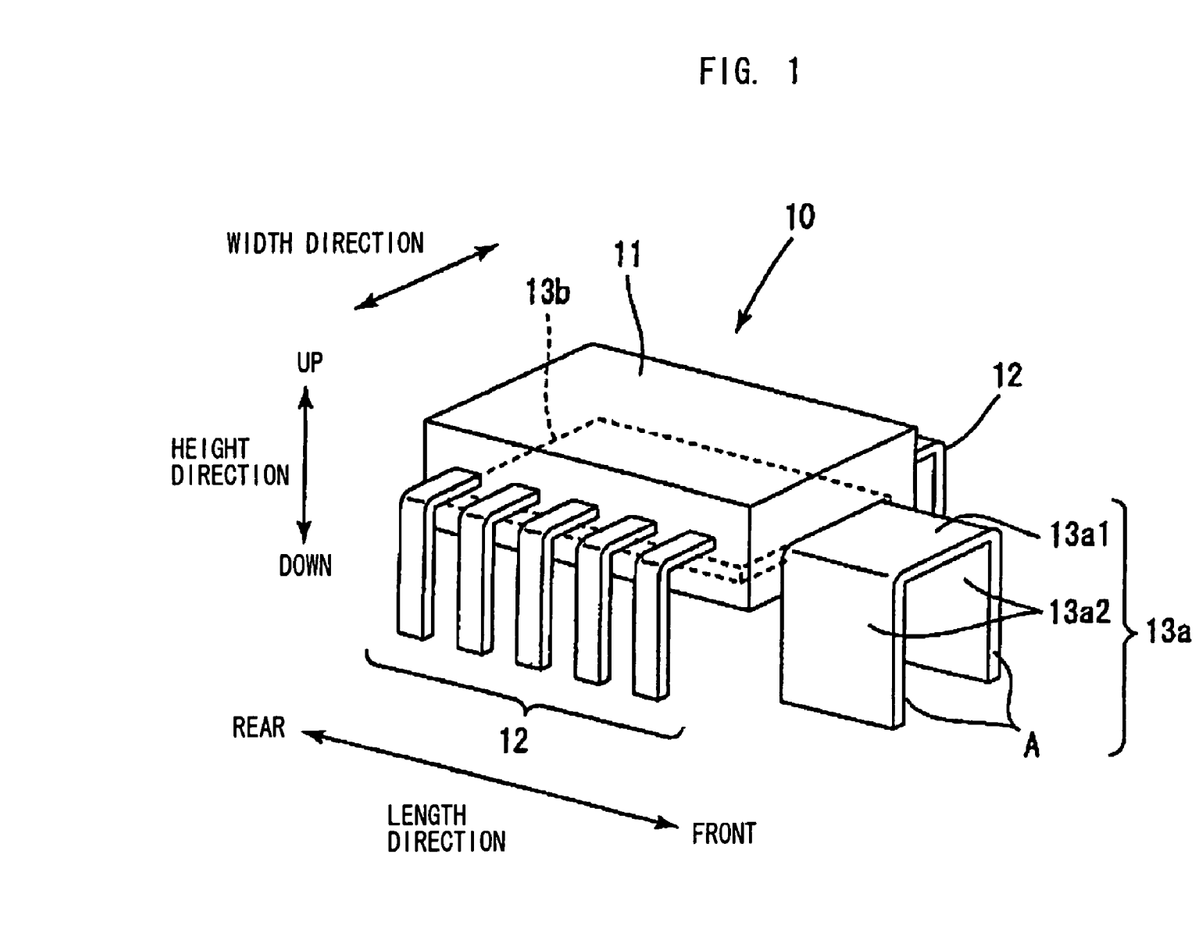
FIG. 1 is a perspective view of a semiconductor component.

There will be described one embodiment of the invention in the following order:

(1) Structure of a semiconductor component (2) Structure of a heatsink (3) Mounting of the semiconductor component and heatsink on a substrate (4) Conclusion (1) Structure of a Semiconductor Component FIG. 1 shows a perspective view of one example of a semiconductor component related to the invention. The semiconductor component 10 shown in FIG. 1 is not yet mounted on a substrate, and arrows in FIG. 1 respectively indicate a width, height and length directions as referred to in the description below. In lateral sides of a sealing case 11 (IC package) opposite to each other in the width direction, there are disposed a plurality of connecting pins 12. The sealing case 11 is a generally rectangular parallelepiped, and made of a ceramic material, a heat-resisting resin, or the like. Each of a plurality of connecting pins 12 is bent in a generally L-shape, so that an end thereof is oriented downward and reaches a level below an undersurface of the sealing case 11. In the sealing case 11 is enclosed an IC chip (not shown) which is electrically connected to the plurality of connecting pins 12.

From a front-side one of two faces of the sealing case 11 opposite to each other in the length direction, a heat release portion 13a of a generally U-shaped metallic radiation fin 13 protrudes. The radiation fin 13 comprises the heat release portion 13a, and a heat absorbing portion 13b (not shown) corresponds to an enclosed portion accommodated in the sealing case 11 and held in contact with the IC chip. Therefore, the heat generated at the IC chip is absorbed by the enclosed portion 13b of the radiation fin and conducted to the heat release portion 13a. That is, the heat radiated from the IC chip inside the sealing case 11 is conducted to the outside of the sealing case 11 by the enclosed portion 13b. The heat release portion 13a has a generally plate-like horizontal part 13a1, and a pair of generally plate-like vertical parts 13a2 which are formed by downwardly bending two end parts, in the width directions, of the horizontal part 13a1. Each of the vertical parts 13a2 extends such that a lower end of each vertical part 13a2 reaches the same level as the end of each connecting pin 12. The lower end of each vertical part 13a2 will be referred to as a "first bonding part A".

(2) Structure of a Heatsink

Figure 2:
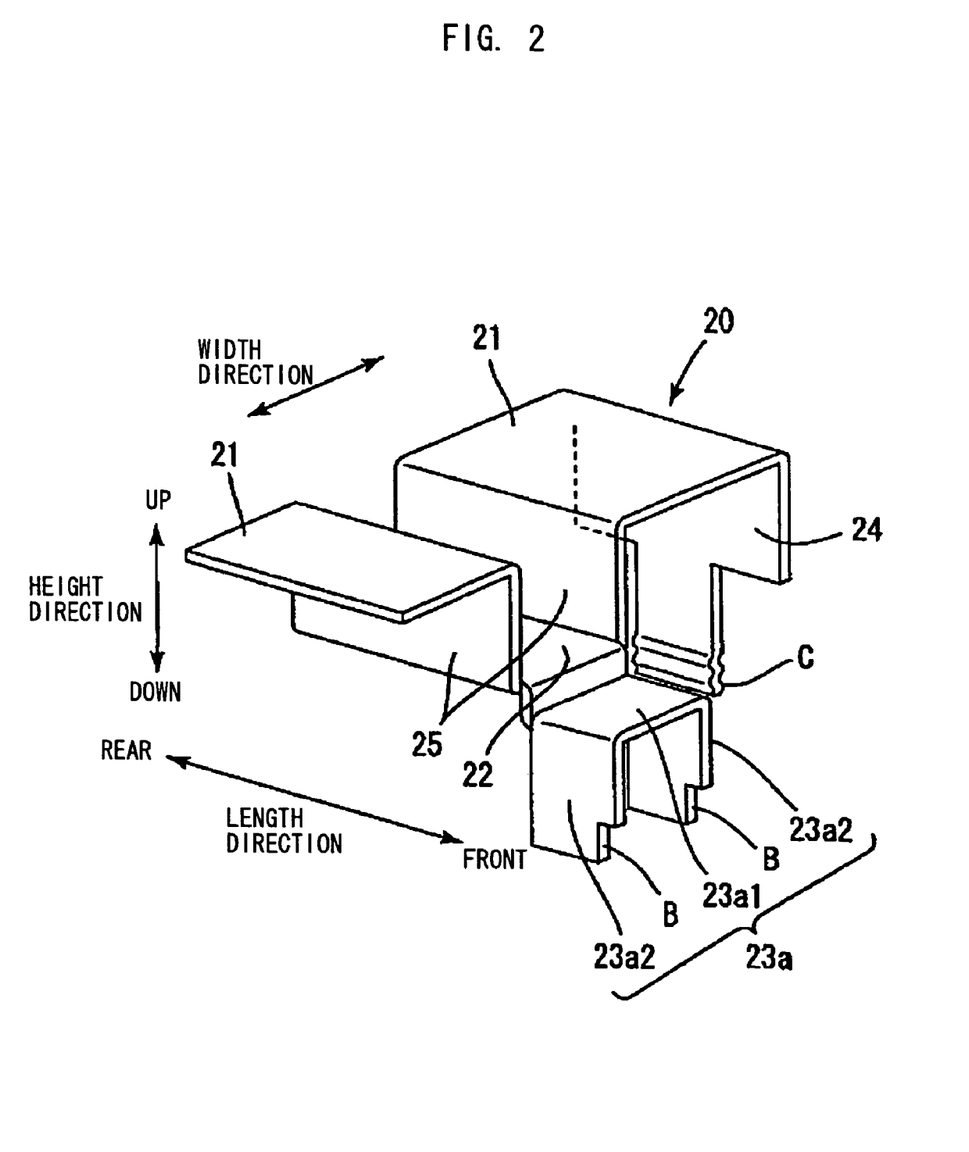
FIG. 2 is a perspective view of a heatsink.

FIG. 2 shows a perspective view of one example of a heatsink related to the invention. The heatsink 20 is formed by performing press molding on a metallic plate having an excellent thermal conductivity, such as an aluminum alloy, and constructed with a plurality of planar parts. It is noted that the material of the heatsink 20 is not limited to a metal, but may be any other materials having a thermal conductivity. The heatsink 20 has a generally plate-like positioning part 22, whose width and length are identical with those of an upper surface of the sealing case 11. Two end parts of the positioning part 22 opposite to each other in the width direction are bent upward, to form a pair of orthogonal parts 25. Upper ends of orthogonal parts 25 respectively extend outwardly in the width direction, to form a pair of heat release wings 21 each having a generally plate-like shape, whose surfaces are substantially parallel to the surface of the positioning part 22. In other words, a pair of generally plate-like heat release wings 21 respectively extend in a crank-like shape from the respective opposite ends of the positioning part 22.

An outer end, in the width direction, of one of the heat release wings is further bent downwardly to form a supporting part 24 substantially perpendicular to the one heat release wing 21. In a lower portion of the supporting part 24, there is formed a third bonding part C whose dimension in the length direction is smaller than that of the other or upper portion of the supporting part 24. The third bonding part C is generally plate-like shaped and corrugated by being bent alternately in the opposite width directions by a small amount.

The positioning part 22 extends frontward also, to form a close contact part 23a, which is generally U-shaped and comprises a horizontal part 23a1 and a pair of vertical parts 23a2 which are formed by bending downwardly lateral end parts, in the width direction, of the horizontal part 23a1. In a lower end portion of each vertical part 23a2 is formed a second bonding part B whose dimension in the length direction is smaller than the other or upper portion of the vertical part 23a2. A level of lower ends of the second connecting parts B and that of the third connecting part C are equal.

Figure 3:
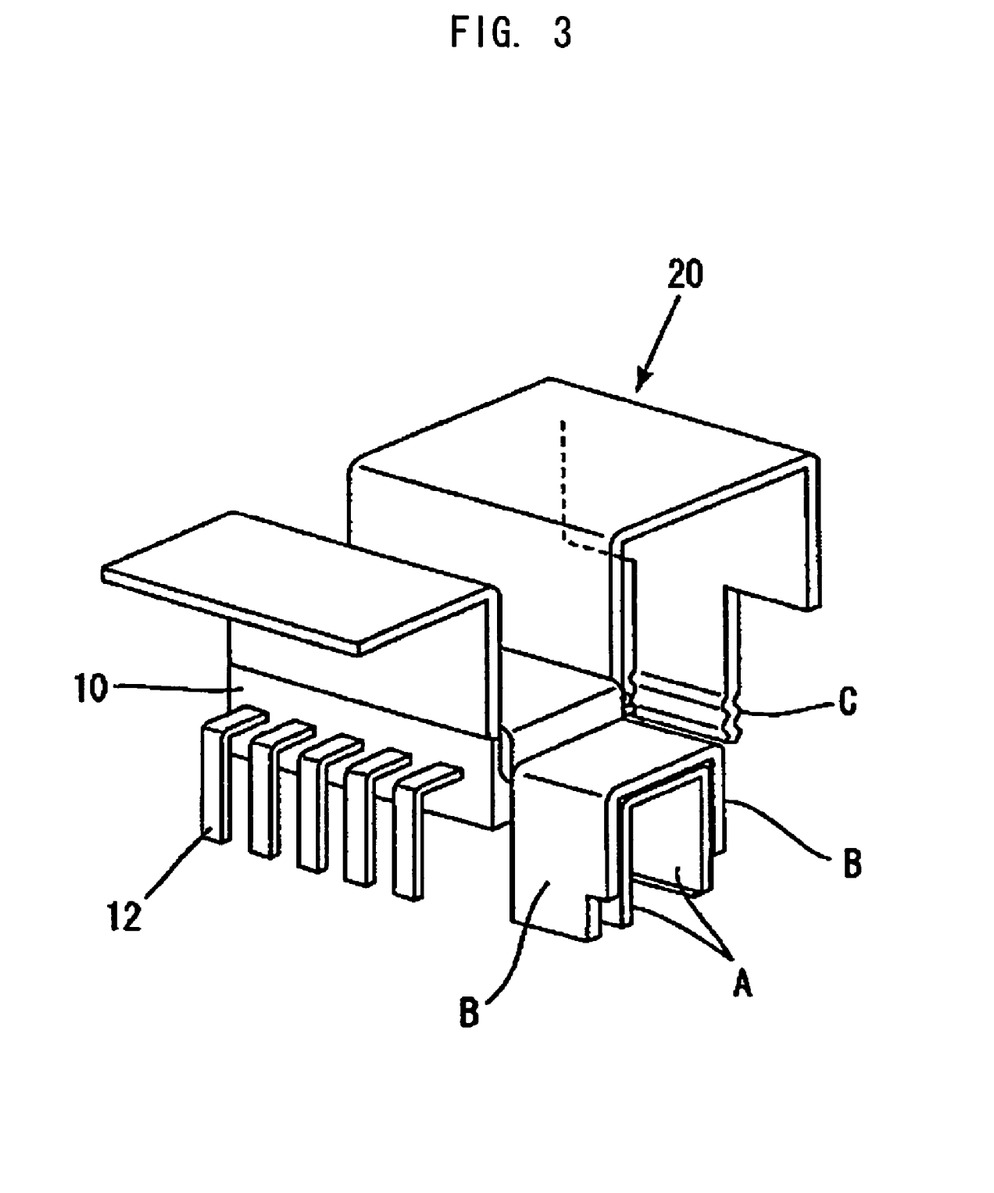
FIG. 3 is a perspective view showing a state where the heatsink is attached to the semiconductor component.

The heatsink 20 can be attached to the semiconductor component 10 by fitting the heatsink 20 on the component 10 from the upper side. FIG. 3 shows a perspective view of a state where the heatsink 20 is attached to the semiconductor component 10. As shown in FIG. 3, an undersurface of the positioning part 22 is held in contact with an upper surface of the sealing case 11. The generally U-shaped close contact part 23a is closely fitted on the heat release portion 13a which is generally U-shaped in a similar way. More specifically, the horizontal part 23a1 of the close contact part 23a contacts the horizontal part 13a1 of the heat release portion 13a from the upper side, and the pair of vertical parts 23a of the close contact part 23a closely contact the pair of vertical parts 13a2 of the heat release portion 13a, respectively, from the outer sides in the width direction.

Since the heatsink 20 can be attached to the semiconductor component 10 such that the generally U-shaped close contact part 23a fits on the generally U-shaped heat release part 13a, as described above, the relative positioning between the heatsink 20 and the semiconductor component 10 can be easily implemented. Further, since the close contact part 23a fits on the heat release part 13a, the state where the heatsink 20 is attached to the component 10 can be maintained, preventing the heatsink 20 from abruptly coming off in the following steps, such as a step of mounting the substrate in a device. Still further, since the positioning part 22 is in contact with the upper surface of the sealing case 11, the heatsink can be positioned in the height direction with reliability. The vertical parts 13a2 of the heat release portion 13a and the vertical parts 23a2 of the close contact part 23a are held in close contact with each other over their entire vertical lengths. Accordingly, respective pairs of the first and second connecting parts A, B are held in close contact with each other, namely, each of the two first connecting parts A formed at the lower ends of the respective vertical parts 13a2 is held in close contact with a corresponding one of the two second connecting parts B formed at the lower ends of the respective vertical parts 23a2. In this state, the lower ends of the first, second and third connecting parts A, B, C are located at the same level as the lower ends of the connecting pins 12.

(3) Mounting of the Semiconductor Component and Heatsink on a Substrate

Figure 4:
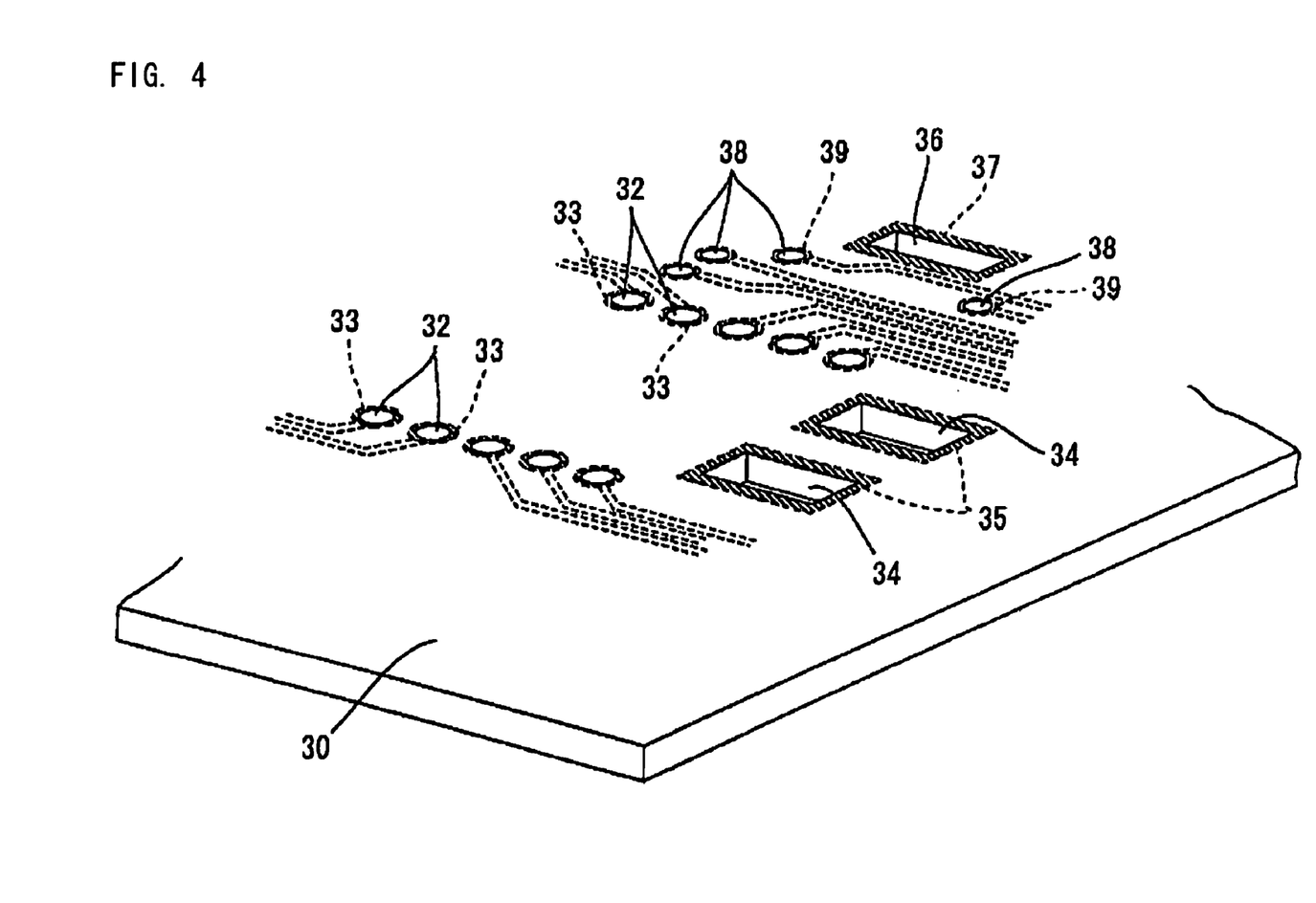
FIG. 4 is a perspective view of a substrate.

FIG. 4 shows a perspective view of apart of the substrate 30 on which the semiconductor component 10 is mounted. The substrate 30 is a single-sided printed wiring board where a pattern is formed merely on a lower or underside surface thereof. The broken line in FIG. 4 represents a copper wiring. In the copper wiring, a resist mask of an insulating resin is not provided on bonding pads 33, 35, 37, 39 as indicated by hatching in FIG. 4, and the copper wiring is exposed downward there. At a central portion of each of generally circular bonding pads 33, there is formed through a thickness of the substrate 30 a circular mounting hole 32. Similarly, at a central portion of each of generally circular bonding pads 39, there is formed through the thickness of the substrate 30 a circular mounting hole 38.

At a central portion of each of a pair of rectangular bonding pads 35, there is formed through the thickness of the substrate 30 a rectangular mounting hole 35, while at a central portion of a rectangular bonding pad 37 is formed through the thickness of the substrate 30 a rectangular mounting hole 36. Unlike the other bonding pads 33, 39, the rectangular bonding pads 35, 37 are not electrically connected to the other parts. That is, the rectangular bonding pads 35, 37 are respectively formed by forming openings in the resist mask in a floating land.

Figure 5:
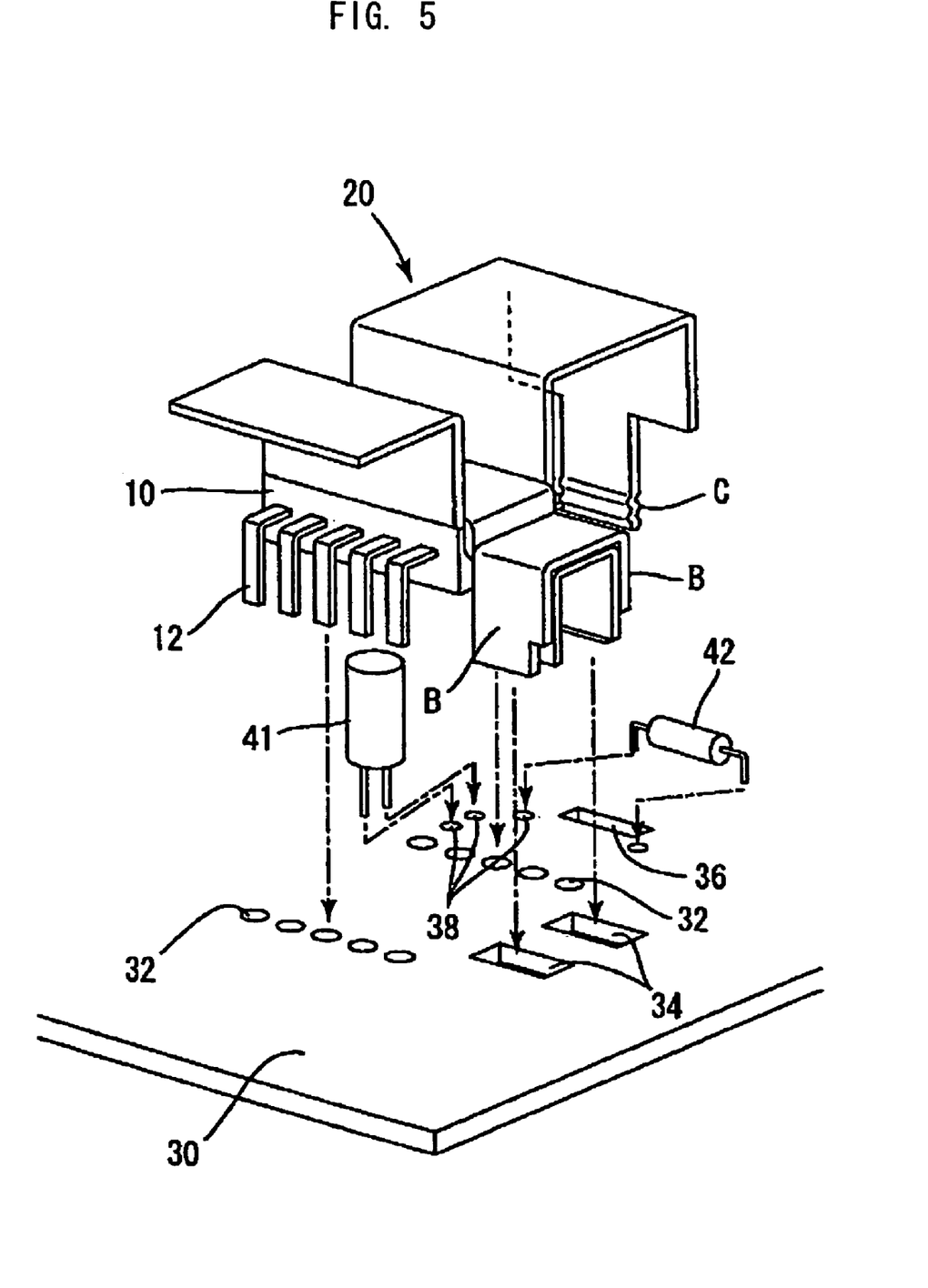
FIG. 5 is a perspective view showing how the semiconductor component and the heatsink are set on the substrate.

FIG. 5 shows how the heatsink 20 as attached to the semiconductor component 10 as shown in FIG. 3 is mounted on the substrate 30. In FIG. 5 is shown how the heatsink 20, the semiconductor component 10, a condenser 41, and a resistor 42 are mounted on the substrate 30 from the upper side. The mounting holes 32 are formed at respective positions corresponding to respective positions of the connecting pins 12, so that lower ends of the connecting pins 12 are inserted into the mounting holes 32 from the upper side of the substrate 30 through to the underside of the substrate 30. The mounting holes 34 are formed at respective positions corresponding to mounting positions of the pairs of first and second connecting parts A, B, so that one of the first connecting parts A and one of the second connecting parts B are together inserted into each of the mounting holes 34 from the upper side of the substrate 30 through to the underside of the substrate 30. The mounting hole 36 is formed at a position corresponding to a mounting position of the third bonding part C, so that the third bonding part C is inserted into the mounting hole 36 from the upper side of the substrate 30 through to the underside of the substrate 30. The mounting holes 38 are formed at respective positions corresponding to mounting positions of the condenser 41 and resistor 42.

By this arrangement, the heatsink 20, semiconductor component 10, condenser 41, and resistor 42 are attached at the respective predetermined mounting positions. When the heatsink 20 and the semiconductor component 10 are attached to the substrate 30, a pressing force can be applied onto the heat release wings 21 which are substantially parallel to the substrate 30 from the upper side, making the attaching step easier. Since the heat release wings 21 are formed on the outer sides of both lateral sides of the semiconductor component 10, the heatsink 20 with the semiconductor component 10 can be pressed to the substrate 30 in a balanced manner. Further, since the third bonding part C is positioned on a side of a substantially central portion of the semiconductor component 10 in the length direction, the heatsink 20 with the semiconductor component 10 can be pressed straight downward in a balanced manner, without being inclined, so that the relevant parts are pushed into the corresponding mounting holes.

Figure 6:
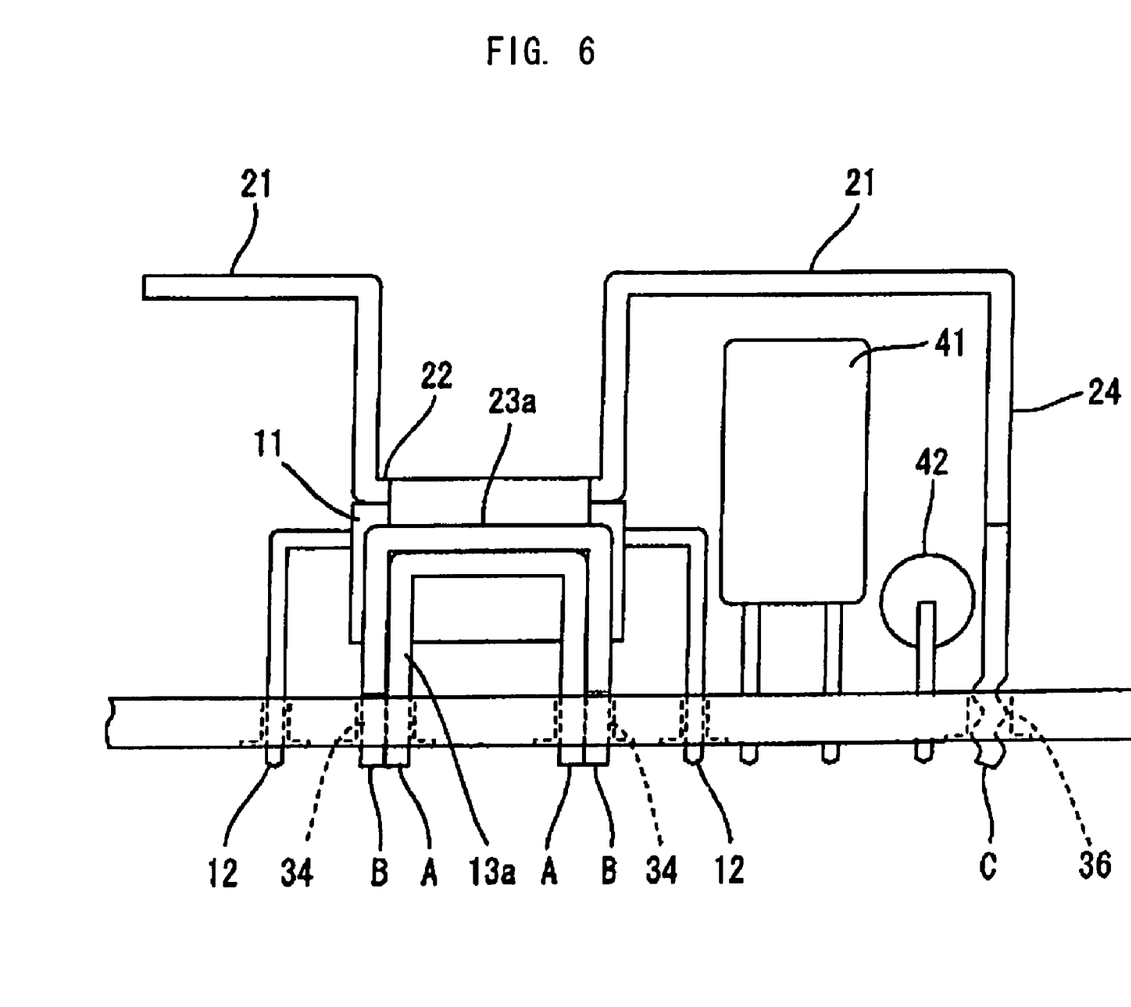
FIG. 6 is a front elevational view showing a state where the semiconductor component and the heatsink are set on the substrate.

FIG. 6 shows a state as viewed from the front side where the heatsink 20, semiconductor component 10, condenser 41 and resistor 42 are set at respective mounting positions. Each of soldered portions of the respective members or components mounted on the substrate is inserted in the corresponding hole through the thickness of the substrate 30, and protrudes from the underside. Each mounting hole 34 has a width wider than a sum of thicknesses of the first and second connecting parts A and B which are inserted into the mounting hole 34 in close contact with each other. One of the heat release wings 21 is in a positional relationship with respect to the condenser 41 and the resistor 42 such that the heat release wing 21, condenser 41 and the resistor 42 overlap in the width direction. However, since the one heat release wing 21 is formed such that the wing 21 extends over the condenser 41 and the resistor 42, the wing 21 does not interfere with the condenser 41 and the resistor 42. That is, a space defined between the heatsink 20 and the substrate 30 can be effectively utilized, not being made a dead space.

On the other hand, the third bonding part C is corrugated by making bends alternately in the opposite width directions, so that the third bonding part C can be caught at and by the mounting hole 36, and prevented from disengaging from the mounting hole 36. Accordingly, the heatsink 20 is neither pulled off the substrate 30 nor inclined, after the heatsink 20 with the semiconductor component 10 is set on the substrate 30. It may be arranged such that the mounting hole 36 is formed at a position shifted from a regular mounting position of the third bonding part C, and the heatsink 20 is attached to the substrate 30 by being elastically deformed. In this case, a restoring force of the heatsink 20 makes the third bonding part C caught at and by the mounting hole 36, making it more unlikely that the heatsink 20 is pulled off the substrate 30. When the heatsink 20 is thus fixed to the substrate 30 with reliability, the semiconductor component 10 interposed between the heatsink 20 and the substrate 30 can also be fixed to the substrate 30 with reliability.

Figure 7:
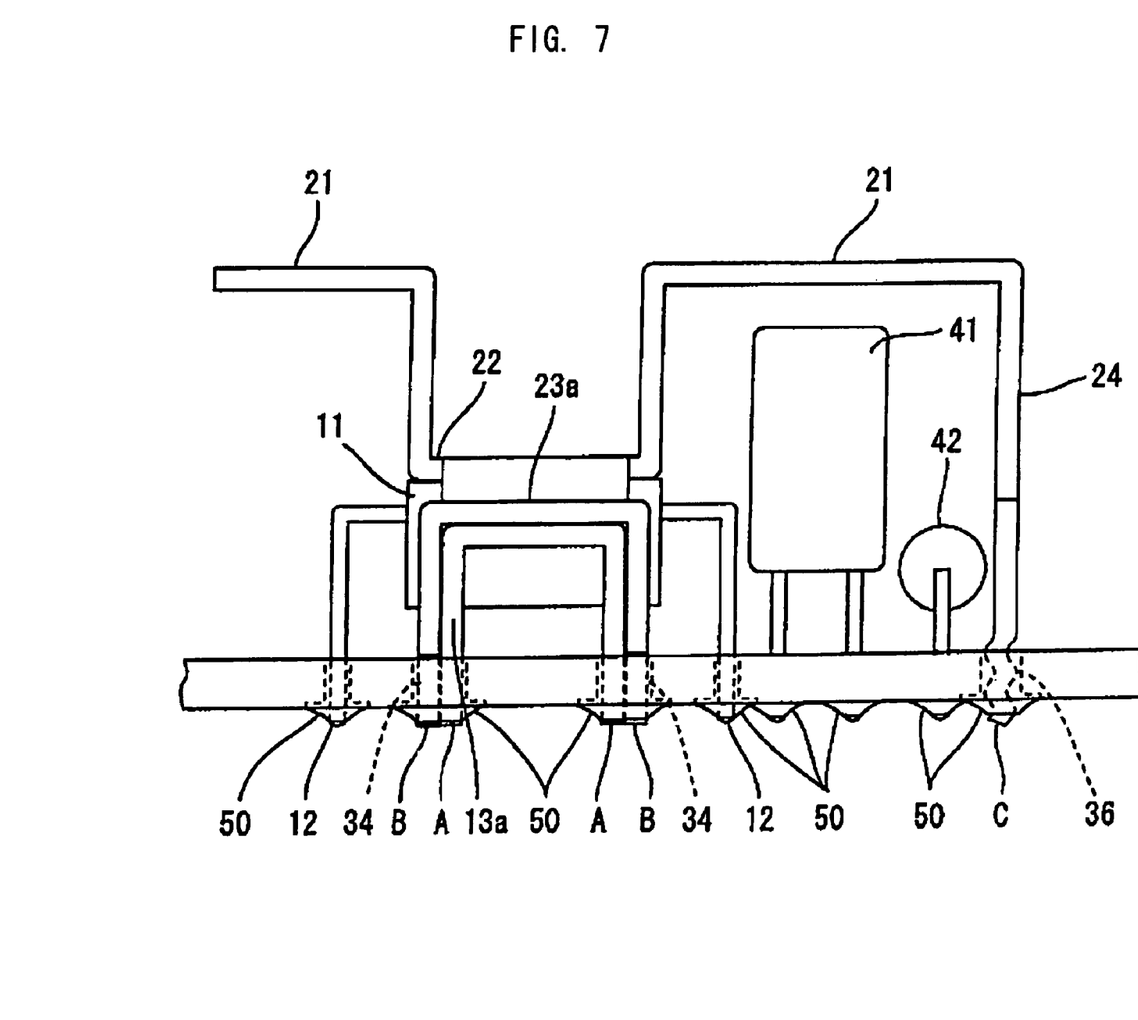
FIG. 7 is a front elevational view showing a state where the semiconductor component and the heatsink are soldered to the substrate.

FIG. 7 shows a state where a soldering step is finished. On the bonding pads 33, 35, 37, 39 formed on the underside of the substrate 30, there are respectively formed solder contacts 50 in the form of solder bumps. By respective solder contacts 50, the connecting pins 12 of the semiconductor component 10 and the pair of the first bonding parts A are soldered to the bonding pads 33, 35, while the pair of second bonding parts B and the bonding part C of the heatsink 20 are soldered to the bonding pads 35, 35, 37, respectively. Similarly, the condenser 41 and resistor 42 are soldered to the bonding pads 39 by respective solder contacts 50.

As a method of forming solder contacts 50 for the respective bonding pads 33, 35, 37, 39, the dip soldering may be employed. In the dip soldering method, each part or component is set at its mounting position on the substrate 30, and in this state, the underside surface of the substrate 30 is immersed in a bath of molten solder. Then, solder droplets adhere to only the bonding pads 33, 35, 37, 39 where the copper wiring having a high solder wettability is exposed. The solder droplets are cooled and solidified to provide the solder contacts 50 in the form of solder bumps.

By thus forming the solder contacts 50, each of the heatsink 20, semiconductor component 10, condenser 41 and resistor 42 are respectively physically fixed to the substrate 30 by the solder contacts 50. Since the solder contacts 50 are electrically conductive, the semiconductor component 10, condenser 41, and resistor 42 can be electrically connectable to predetermined points in the wiring of the substrate 30. The heatsink 20 is bonded to the substrate 30 at a total of three points, namely, the pair of second bonding parts B and the third bonding part C, and therefore can be firmly fixed to the substrate 30. Since the bonding pads 35, 37 to which the heatsink 20 is bonded are electrically floating, even if the heatsink 20 is pulled to be detached from the substrate 30, causing the bonding pads 35, 37 to be separated from the wiring pattern, there occurs no electric defects.

The heat release portion 13a of the semiconductor component 10 and the close contact part 23a of the heatsink 20 are held in close contact with each other when soldered to each other. Hence, the heat transferred to the heat release part 13a of the semiconductor component 10 from the IC chip can be conducted to the heatsink 20 at the contact portion between the heat release part 13a and the close contact part 23a, with reliability. Since the heat release part 13a of the component 10 and the close contact part 23a of the heatsink 20 are both generally U-shaped, providing a relatively large contact area. Thus, an increased amount of heat can be conducted to the heatsink 20. The heat conducted to the heatsink 20 is further transferred to the heat release wings 21 and others, so that the heat can be released at locations remote from the semiconductor component 10. Further, since the positioning part 22 is also held in contact with the upper surface of the sealing case 11, the heatsink 20 can absorb the heat from the upper surface of the sealing case 11 also.

Figure 8:
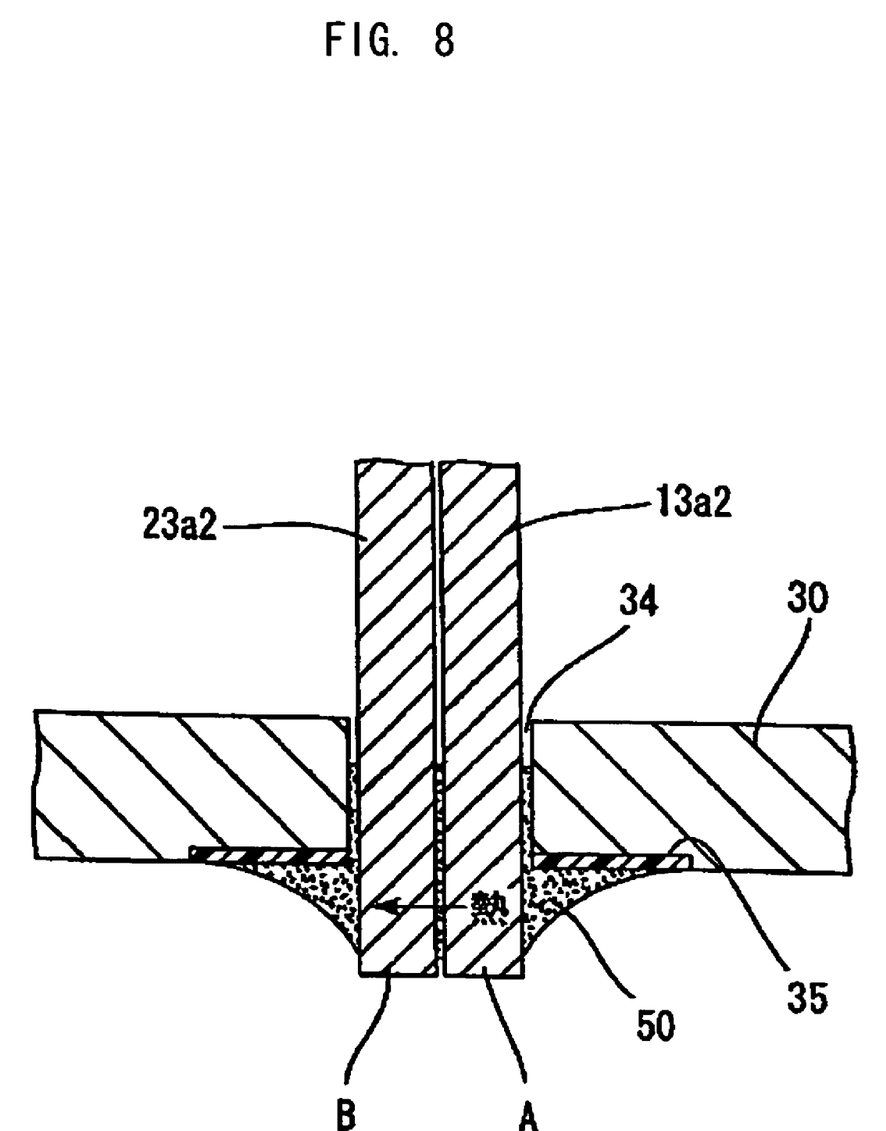
FIG. 8 is a cross sectional view showing a first bonding part A and a second bonding part B.

FIG. 8 is a cross sectional view of the first bonding part A of the semiconductor component 10, the second bonding part B of the heatsink 20, and the solder contact 50. In FIG. 8, the first bonding part A of the component 10 and the second bonding part B of the heatsink 20 in close contact with each other are inserted into the mounting hole 34. The solder contact 50 is formed on the bonding pad 35 having a high solder wettability. The mounting hole 34 is located at a substantially central part of the bonding pad 35, and the height of the solder contact 50 is the maximum at the position where the first and second bonding parts A, B are inserted into the mounting hole 34 through to the back surface of the substrate 30.

Although the first and second bonding parts A, B are in close contact with each other as described above, there may occur a slight clearance therebetween, due to the manufacturing error and asperity on the surfaces of the bonding parts A, B. In such a case, the contact area between the first and second bonding parts A, B is reduced, deteriorating the heat conduction. However, since in this embodiment the first and second bonding parts A, B are bonded to the substrate 30 by means of a common solder contact 50 formed on a common bonding pad 35, the heat can be conducted via the solder contact 50 having an excellent thermal conductivity. Thus, the heat can be conducted to the heatsink 20 more reliably. Further, molten solder having a fluidity can get in the clearance between the first and second bonding parts A, B and solidify there. Therefore, even if a clearance occurs between the first and second bonding parts A, B as shown in FIG. 8, a shortest path of heat conduction as indicated by an arrow can be formed. Further, the heat can be guided to the back surface of the substrate 30 also, enabling to release part of the heat there.

In a case where the semiconductor component 10 and the heatsink 20 are fixed to each other by using a screw or by engagement in some other ways, a clearance may occur between the contact portions of the component 10 and the heatsink 20 depending upon the way of driving the screw or others. However, in this embodiment where the component 10 and heatsink 20 are bonded to each other by soldering, an undesirable load is not applied to the component 10 and heatsink 20, lowering the possibility that the clearance is formed therebetween due to the deformation of the component 10 and/or the heatsink 20. In addition, according to the embodiment, even if such a clearance occurs, the solder flows into the clearance to be interposed between the component 10 and the heatsink 20, so that the heat can be efficiently conducted. Since the fixing of the first bonding part A to the substrate 30 and the fixing of the second bonding part B to the substrate 30, and the bonding of the first and second bonding parts A, B to each other can be implemented by means of the common solder contact 50 formed on the common bonding pad 35, it is made unnecessary to separately forming solder contacts for the respective fixing and bonding, respectively. Thus, deterioration in the operating efficiency or an increase in the number of required steps can be avoided. That is, since soldering the other electronic components, such as the condenser 41 and resistor 42, to the substrate can be performed at the same time the semiconductor component 10 and heatsink 20 are bonded to each other, it is not necessary to specially performing the bonding between the component 10 and heatsink 20.

To allow the solder to flow into the clearance between the first and second bonding parts A, B, the solder should have a fluidity during the step of forming the solder contacts. Therefore, the solder contacts may be formed, such that a soldering paste is applied to the relevant points and then melted by a reflow treatment, or by solder plating. Or alternatively, the solder contacts may be formed by applying molten solder on the bonding pads 35 by using a soldering iron. In either method, the molten solder is applied to the bonding pads 35 to which both the first and second bonding parts A, B are bonded, and the number of points at which the molten solder should be applied is relatively small, simplifying the step of forming the solder contacts. In the present embodiment, a contact point or area between the first and second bonding parts A, B similar to that as shown in FIG. 8 is actually provided at another place, thereby further enhancing the efficiency of heat conduction.

Figure 9:
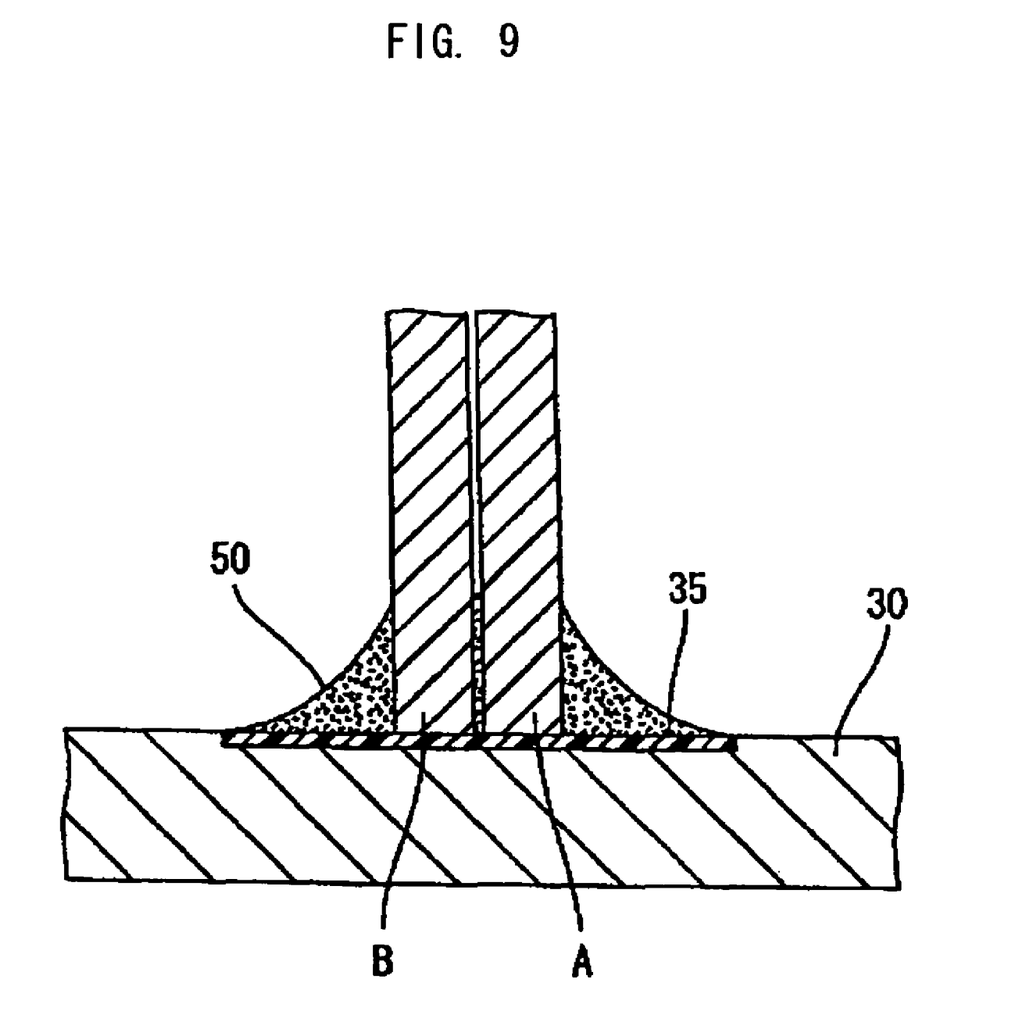
FIG. 9 is another cross sectional view showing the first bonding part A and the second bonding part B.

There has been described the embodiment where the soldering is performed on the back surface of the substrate 30, by way of example. However, the soldering may not be necessarily performed on the back surface. For instance, as shown in FIG. 9, the soldering may be performed on the upper or mounting surface of the substrate 30. In this case, a soldering paste is printed on the bonding pads 35 by screen printing, and next the semiconductor component 10 and heatsink 20 are set on the substrate 30 at respective mounting positions, and then there flow treatment is performed. Since the soldering past is melted during the reflow treatment, the soldering paste can be introduced into the clearance between the first and second bonding parts A, B and solidify there. The composition of the solder is not particularly limited, and a Pb-free solder may be employed.

(4) Conclusion

As described above, since the heatsink according to the invention can be bonded with reliability to the semiconductor component by soldering, the efficiency of heat dissipation can be improved. Further, since the molten solder flows into the clearance between the heatsink and the semiconductor component, the efficiency of heat dissipation is not deteriorated due to the presence of the clearance. Still further, since it is not necessary to form solder contacts for bonding the heatsink and the semiconductor component to each other, separately from solder contacts for bonding the heatsink and the semiconductor component to the substrate, no additional operations for attaching the heatsink to the semiconductor component is needed.

The foregoing invention has been described in terms of preferred embodiments. However, those skilled, in the art will recognize that many variations of such embodiments exist. Such variations are intended to be within the scope of the present invention and the appended claims.

What is claimed is:

1. A heatsink formed of a plurality of metallic planar parts, which is connected to an IC package having a radiation fin, the heatsink comprising:

a radiation fin connecting portion which is connected to the radiation fin, and formed such that opposite ends of an elongate rectangular part are bent substantially at a right angle in the same direction, so that the radiation fin connecting portion comprises a horizontal part and a pair of vertical parts; and a heat release portion which extends from the radiation fin connecting portion, and comprises:

a planar positioning part extending from a side of the horizontal part of the radiation fin connecting portion from which the vertical parts do not extend, in a direction to get away from the vertical parts; and a pair of heat release wings which are formed such that each of lateral end parts of the positioning part with respect to a direction in which the positioning part extends from the horizontal part, is bent in a direction to get away from the positioning part in a crank-like shape, one of the heat release wings being further bent at its end part substantially at a right angle in the same direction as the vertical parts, to provide a supporting part whose end part is corrugated.

2. A heat sink, comprising:

a positioning part having a horizontal surface;

a pair of orthogonal parts that are parallel in relation to one another and extending substantially perpendicular the horizontal surface longitudinally along an axial length of the horizontal surface of the positioning part; and a pair of heat release wings extending divergently from the pair of orthogonal parts in a direction parallel the horizontal surface of the positioning part and oriented substantially perpendicular to the pair of orthogonal parts.

3. The heat sink as set forth in claim 2, wherein:

one heat release wing of the pair of heat release wings further extending in a direction towards the positioning part to form a supporting part, extending perpendicular the pair of heat release wings and parallel along a horizontal plane of the pair of orthogonal parts.

4. The heat sink as set forth in claim 3, wherein:

the positioning part includes a fore end along a width of the horizontal surface;

the fore end extended to form a close contact part having a horizontal part, which is substantially parallel the horizontal surface of the positioning part, and two vertical parts substantially perpendicular to the horizontal part, oriented to extend in the same direction as the supporting part.

5. The heat sink as set forth in claim 4, wherein:

an end part of the supporting part is corrugated.

6. A heat sink coupled with an Integrated Circuit (IC) package having a heat radiation element, the heat sink comprising:

a positioning part having a horizontal surface in contact with a heat absorbing portion of the heat radiation element of the IC package;

a pair of orthogonal parts that are parallel in relation to one another and extending substantially perpendicular the horizontal surface longitudinally along an axial length of the horizontal surface of the positioning part; and a pair of heat release wings extending divergently from the pair of orthogonal parts in a direction parallel the horizontal surface of the positioning part and oriented substantially perpendicular to the pair of orthogonal parts.

7. The heat sink coupled with an Integrated Circuit (IC) package having a heat radiation element as set forth in claim 6, wherein:

one heat release wing of the pair of heat release wings further extending in a direction towards the positioning part to form a supporting part, extending perpendicular the pair of heat release wings and parallel along a horizontal plane of the pair of orthogonal parts.

8. The heat sink coupled with an Integrated Circuit (IC) package having a heat radiation element as set forth in claim 6, wherein:

the positioning part includes a fore end along a width of the horizontal surface;

the fore end extended to form a close contact part that contacts with a heat release portion of the heat radiation element;

the fore end having a horizontal part, which is substantially parallel the horizontal surface of the positioning part, and two vertical parts substantially perpendicular to the horizontal part, oriented to extend in the same direction as the supporting part.

9. The heat sink coupled with an Integrated Circuit (IC) package having a heat radiation element as set forth in claim 8, wherein:

an end part of the supporting part is corrugated.

10. The heat sink coupled with an Integrated Circuit (IC) package having a heat radiation element as set forth in claim 8, wherein:

the fore end is substantially configured to conform and contact with the heat release portion of the heat radiation element of the IC package.

* * * * *